United States Patent [19]

Ogure et al.

[11] Patent Number: 5,820,649
[45] Date of Patent: Oct. 13, 1998

[54] METHOD OF AND APPARATUS FOR CONTINUOUSLY PRODUCING A SOLID MATERIAL

[75] Inventors: Naoaki Ogure, Tokyo; Kazuyoshi Terashima, Matsudo, both of Japan

[73] Assignee: Ebara Corporation, Tokyo, Japan

[21] Appl. No.: 843,185

[22] Filed: Apr. 14, 1997

[30]     Foreign Application Priority Data

Nov. 25, 1996  [JP]  Japan ................................. 8-329106

[51] Int. Cl.$^6$ .................................................. C03B 20/00
[52] U.S. Cl. .............................. 65/66; 65/29.17; 117/13;
117/18; 117/31; 117/33; 117/211; 117/213; 117/214
[58] Field of Search ........................ 65/66, 29.17; 117/13,
117/18, 31, 33, 211, 213, 214, 912, 922

[56]                 References Cited

U.S. PATENT DOCUMENTS

| | | | |
|---|---|---|---|
| 3,206,286 | 9/1965 | Bennett, Jr. et al. | 117/202 |
| 3,305,485 | 2/1967 | Burmeister et al. | 117/31 |
| 3,507,625 | 4/1970 | Deyris | 117/213 |
| 4,036,595 | 7/1977 | Lorenzini et al. | 117/202 |
| 4,282,184 | 8/1981 | Fiegl et al. | 117/202 |
| 4,454,096 | 6/1984 | Lorenzini et al. | 117/213 |
| 4,547,258 | 10/1985 | Witter et al. | 117/21 |
| 4,710,260 | 12/1987 | Witter et al. | 423/350 |
| 5,030,315 | 7/1991 | Washizuka et al. | 117/15 |
| 5,069,741 | 12/1991 | Kida et al. | 117/31 |
| 5,270,020 | 12/1993 | Suzuki et al. | 117/31 |
| 5,290,395 | 3/1994 | Matsumoto et al. | 117/18 |

FOREIGN PATENT DOCUMENTS 32 17 686  11/1983  Germany.
59-217695  12/1984  Japan.

OTHER PUBLICATIONS

Electronic Parts and Materials, vol. 27, pp. 6–7, Jun. 1988, "Toshiba Develops a New Method for Manufacturing a Single Crystal Of Si" (with English Translation).

Patent Abstracts of Japan, vol. 8, No. 3 (C–203), Jan. 7, 1984, JP 58 172287, Oct. 11, 1983.

G. Fiegl, Solid State Technology, vol. 26, No. 8, pp. 121–131, "Recent Advances and Future Directions in CZ–Silicon Crystal Growth Technology", Aug. 1983.

Primary Examiner—Stanley S. Silverman
Assistant Examiner—Sean Vincent
Attorney, Agent, or Firm—Oblon, Spivak, McClelland, Maier & Neustadt, P.C.

[57]              ABSTRACT

A liquid material such as molten silicon is stored in a crucible. A liquid material, which is identical to and held in the same conditions as the liquid material in the crucible, is continuously supplied from an auxiliary crucible to the crucible to keep constant the surface level of the liquid material in the crucible. The liquid material is continuously pulled up from the crucible at a predetermined speed while the liquid material is being solidified into a solid material such as a ribbon-like thin web of single-crystal silicon.

5 Claims, 2 Drawing Sheets

METHOD OF AND APPARATUS FOR CONTINUOUSLY PRODUCING A SOLID MATERIAL

BACKGROUND OF THE INVENTION

1. Field of the Invention:

The present invention relates to a method of and an apparatus for continuously producing a solid material such as a ribbon-like thin web of single-crystal silicon for use primarily as a material of a photoelectric transducer device such as a solar cell or the like.

2. Description of the Prior Art:

One general apparatus for continuously producing a ribbon-like thin web (a solid material) of single-crystal silicon from a molten pool of silicon (a liquid material) is illustrated in FIG. 1 of the accompanying drawings.

As shown in FIG. 1, the apparatus has a chamber 1 for maintaining an inert gas atmosphere therein by introducing an inert gas such as an argon gas or the like through a combination of measurement and inert gas inlet window 1a defined in a wall of the chamber 1. The chamber 1 houses a crucible 3 of a heat-resistant material for storing molten silicon 2 as a liquid material therein.

The crucible 3 has an upper opening defined in an upper end thereof and is surrounded by a susceptor 4 which extends around the bottom and side wall, but not the upper opening, of the crucible 3. The upper opening of the crucible 3 is closed by a cover 5 having a central through-hole 5a defined vertically therein. A vertical stack of three cooling plates 6 surrounded by a heat shield wall 7 is mounted on the cover 5. The cooling plates 6 have respective central through holes 6a which are progressively larger in diameter in the upward direction.

The susceptor 4 is surrounded by a heating means 8 for heating the molten silicon 2 up to a constant temperature equal to or higher than the melting point of the molten silicon 2. The heating means 8 may comprise a high-frequency coil or the like. The heating means 8 is movable vertically along the susceptor 4 by an actuating mechanism 9 which is disposed below the chamber 1 and coupled to the heating means 8.

A material supply pipe 10 extends downwardly from above the chamber 1 into the chamber 1, and has an upper end connected to a funnel-shaped material inlet 10a and a lower end opening positioned slightly above the surface level of the molten silicon 2 in the crucible 3. The chamber 1 supports on its upper end a positioning and pulling-up mechanism 11 which comprises a pair of rollers positioned on each side of an opening 1b that is defined in the upper end of the chamber 1.

In operation, the molten silicon 2 in the crucible 3 is continuously pulled up at a predetermined speed through the opening 5a in the cover 5 and the openings 6a in the cooling plates 6. At this time, the molten silicon 2 as it is pulled up is cooled and solidified into a continuously elongate thin web 12 of single-crystal silicon having a width of 50 mm and a thickness of 0.14 mm, for example. The solidified web 12 of single-crystal silicon is pulled upwardly out of the chamber 1 at a constant speed by the positioning and pulling-up mechanism 11.

As the molten silicon 2 is continuously removed as the thin web 12 of single-crystal silicon from the crucible 3, the amount of the molten silicon 2 stored in the crucible 3 is reduced, and the surface level of the molten silicon 2 is lowered. To make up for the reduction in the amount of the molten silicon 2 in the crucible 3 for ensuring continuous silicon crystal growth, a silicon material in the form of silicon pellets each having a diameter ranging from 0.1 to 1 mm is supplied through the material supply pipe 10 into the crucible 3.

If it is assumed that the continuously elongate thin web 12 of single-crystal silicon is upwardly pulled up at a speed of 15 mm/min. from the crucible 3 which has a surface area of 17000 mm² (60 mm×280 mm) while the crucible 3 is not being supplied with the silicon material, then the surface level of the molten silicon 2 in the crucible 3 is lowered at a speed of:

$$(50 \times 0.14 \times 15)/17000 = 6.18 \times 10^{-3} \text{ (mm/min.)}$$
$$= 6.18 \, \mu\text{m/min.}$$

For continuous silicon crystal growth over a long period of time, it is necessary to compensate for the above reduction in the surface level of the molten silicon 2 in the crucible 3 with the supply of the silicon material from the material supply pipe 10, thereby keeping the surface level constant at all times.

The temperature of the molten silicon 2 at a meniscus 2a that is joined to the elongate thin web 12 is slightly lower than the melting point of silicon (the meniscus 2a is overly cooled). The crucible 3 is required to be controlled in temperature to solidify the molten silicon 2 continuously at the meniscus 2a for thereby producing the thin web 12 of single-crystal silicon in a highly limited temperature range. It is important that a certain temperature distribution be maintained constantly in the crucible 3 at all times.

If the temperature distribution exceeds an adequate level, then the molten silicon 2 stops being continuously solidified at the meniscus 2a, interrupting the production of the thin web 12 of single-crystal silicon, which is pulled out of the molten silicon 2. If the temperature distribution drops below the adequate level, then solidified kernel grows to spread from a desired region (distal ends of bounding dendrites) to another region (third dendrites), eventually producing polycrystalline silicon. At present, the temperature tolerance allowed for the temperature distribution is very small, possibly on the order of 0.1° C.

Since the crucible 3 is directly heated by the heating means 8, any variation in the temperature of the molten silicon 2 in the crucible 3 may possibly be unduly increased due to an increase or decrease in the amount of thermal energy supplied from the heating means 8. For this reason, it has been difficult to keep the temperature distribution in the crucible 3 within the temperature tolerance continuously over a long period of time. Specifically, it has occasionally been experienced that a variation in the temperature of the molten silicon 2 in the crucible 3 exceeds the temperature tolerance required for the stable production of the thin web 12 of single-crystal silicon due to the time constant and thermal inertia of the entire apparatus.

As described above, when the pelletized silicon material is supplied through the material supply pipe 10, it falls, with a certain weight, intermittently (stepwise, discretely, or uncontinuously) into the molten silicon 2 in the crucible 3. The intermittent supply of the pelletized silicon material brings about a periodic or irregular transient temperature reduction in the molten silicon 2. Therefore, it tends to promote the above problem of the possible deviation of the temperature distribution from the temperature tolerance.

It has been practiced to place a baffle or a partition or form a bank in the crucible 3 for suppressing temperature variations caused by the supply of the pelletized silicon material. However, these schemes are not effective enough to reduce those temperature variations.

SUMMARY OF THE INVENTION

It is therefore an object of the present invention to provide a method of and an apparatus for stably and continuously producing a solid material from a liquid material in a crucible by keeping the temperature of the liquid material in a predetermined temperature tolerance at all times.

To achieve the above object, there is provided in accordance with the present invention a method of continuously producing a solid material from a liquid material, comprising the steps of storing a liquid material in a crucible, continuously supplying a liquid material, which is identical to and held in the same conditions as the liquid material in the crucible, to the crucible to keep constant a surface level of the liquid material in the crucible, and continuously pulling the liquid material upwardly from the crucible at a predetermined speed while the liquid material is being solidified into a solid material.

Since the temperature of the liquid material continuously supplied to the crucible can be stabilized highly accurately with relative ease, and the liquid material, rather than a pelletized material, is continuously supplied to the crucible, the surface level of the liquid material is kept constant in the crucible, and any variation in the temperature of the liquid material in the crucible is held within a predetermined temperature tolerance.

In the above method, the liquid material may comprise molten silicon and/or the solid material comprises a ribbon-like thin web of single-crystal silicon.

The step of continuously supplying the liquid material may comprise the step of continuously supplying the liquid material from another crucible having a volume which is 1.5 to 100 times the volume of the first-mentioned crucible.

According to the present invention, there is also provided an apparatus for continuously producing a solid material from a liquid material, comprising a first crucible for storing a liquid material therein, a second crucible for storing a liquid material which is identical to and held in the same conditions as the liquid material in the first crucible, the first crucible and the second crucible being connected to each other at a position below surface levels of the respective liquid materials in the first and second crucibles, a material supply device mounted on the second crucible for supplying a material to the second crucible, and a pulling-up mechanism mounted on the first crucible for continuously pulling the liquid material upwardly from the first crucible at a predetermined speed while the liquid material is being solidified into a solid material.

Inasmuch as the first and second crucibles are connected to each other, the total thermal energy of the liquid material in the first and second crucibles is large enough to stabilize the liquid material highly accurately. The material supply device supplies the material to the second crucible to keep constant the surface level of the liquid material in the second crucible, with the result that the surface level of the liquid material in the first crucible is maintained constant. Consequently, any variations in the temperature of the liquid material in the first crucible due to the supply of the material to the second crucible are minimized.

In the above apparatus, the liquid material may comprise molten silicon and/or the solid material comprises; a ribbonlike thin web of single-crystal silicon.

The second crucible may have a volume which is 1.5 to 100 times the volume of the first crucible.

The apparatus may further comprise a horizontal joint pipe interconnecting the first crucible and the crucible. The apparatus may further comprise a first chamber housing the first crucible therein and a second chamber housing the second crucible therein, with the horizontal joint pipe interconnecting the first crucible and the second crucible through the first chamber and the second chamber.

The above and other objects, features, and advantages of the present invention will become apparent from the following description when taken in conjunction with the accompanying drawings which illustrate a preferred embodiment of the present invention by way of example.

DETAILED DESCRIPTION OF THE PREFERRED EMBODIMENT

Figure 2:
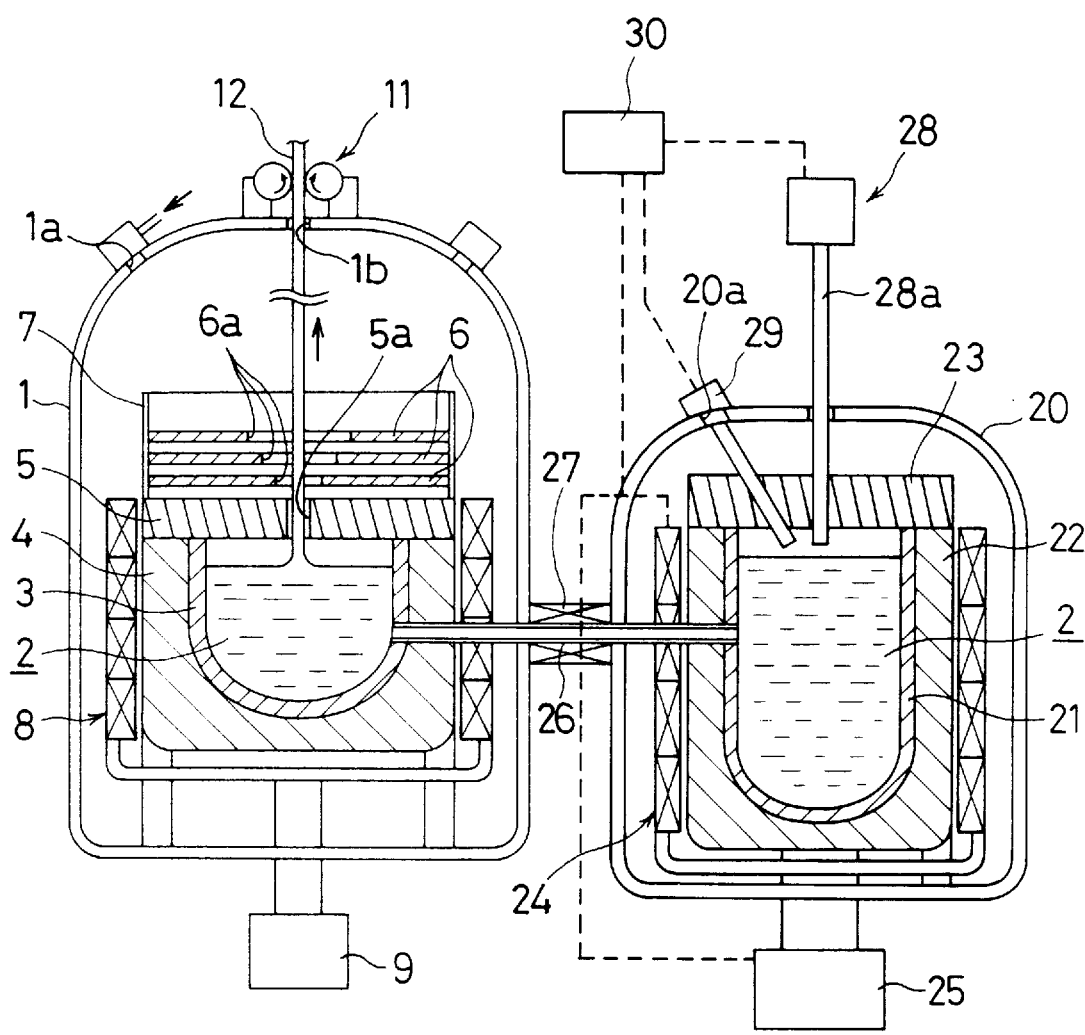
FIG. 2 is a vertical cross-sectional view of an apparatus for producing a solid material according to the present invention, as embodied as an apparatus for continuously producing an elongate thin web of single-crystal silicon from a liquid material.

As shown in FIG. 2, an apparatus for producing a solid material according to the present invention is embodied as an apparatus for continuously producing an elongate thin web of single-crystal silicon from a liquid material. In FIG. 2, the apparatus includes a chamber 1 having a combination of measurement and inert gas inlet window 1a, a crucible 3 of a heat-resistant material disposed in the chamber 1, a susceptor 4 surrounding the crucible 3, a cover 5 closing an upper opening of the crucible 3, and a vertical stack of three cooling plates 6 mounted on the cover 5 and surrounded by a heat shield wall 7 which may be in the form of a hollow cylinder or rectangular shaped. The susceptor 4 is surrounded by a heating means 8, which may comprise a high-frequency induction heating coil or the like. The heating means 8 is movable vertically along the susceptor 4 by an actuating mechanism 9. The chamber 1 supports on its upper end a positioning and pulling-up mechanism 11.

Figure 1:
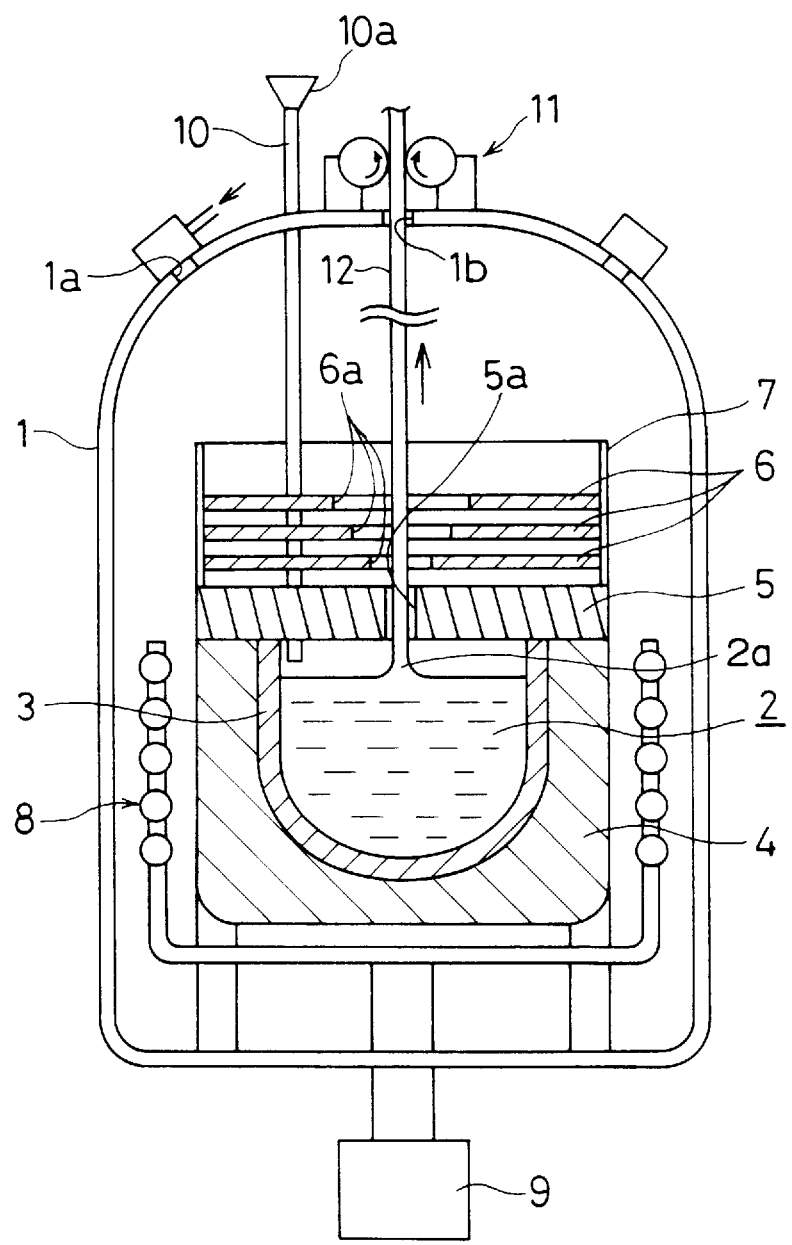
FIG. 1 is a vertical cross-sectional view of a conventional apparatus for continuously producing an elongate thin web of single-crystal silicon.

The chamber 1 and the other components described above which are disposed in and supported on the chamber 1 are identical to those of the conventional apparatus shown in FIG. 1, and will not be described in greater detail.

As shown in FIG. 2, the apparatus also includes an auxiliary chamber 20 having a measurement window 20a defined in a wall thereof. The auxiliary chamber 20 houses therein an auxiliary crucible 21 of a heat-resistant material for storing molten silicon 2 as a liquid material therein.

The crucible 21 has an upper opening defined in an upper end thereof and is surrounded by a susceptor 22 which extends around the bottom and side wall, but not the upper opening, of the crucible 21. The upper opening is closed by a cover 23. The susceptor 22 is surrounded by a heating means 24 for heating the molten silicon 2 up to a constant temperature equal to or higher than the melting point of the molten silicon 2. The heating means 24 may comprise a high-frequency induction eating coil or the like. The heating means 24 is movable vertically along the susceptor 22 by an actuating mechanism 25 which is disposed below the chamber 21 and coupled to the heating means 24.

Each of the heating means 8, 24 comprises a plurality of individually controllable heating elements which are successively positioned axially and circumferentially around the susceptor 4 or 22. The heating elements can independently be energized or de-energized to control the temperature of the molten silicon 2 in the crucible 21.

The heating elements of each of the heating means 8, 24 may be high-frequency induction heating elements in the form of high-frequency coils, electric resistance heating elements, microwave heating elements, arc heating elements, plasma heating elements, dielectric heating elements, electron beam heating elements, laser beam heating elements, or the like.

The crucibles 3, 21 are interconnected in a liquid-tight fashion by a horizontal cylindrical joint pipe 26 which allows the molten silicon 2 to flow between the crucibles 3, 21. The horizontal cylindrical joint pipe 26 has a portion exposed between the chambers 1, 20 and covered with an insulator 27. The horizontal cylindrical joint pipe 26 has an end extending through the heating means 8, the susceptor 4, and the wall of the crucible 3 and opening into the crucible 3 below the surface level of the molten silicon 2 in the crucible 3, and an opposite end extending through the heating means 24, the susceptor 22, and the wall of the crucible 21 and opening into the crucible 21 below the surface level of the molten silicon 2 in the crucible 21.

Because of the joint pipe 26 interconnecting the crucibles 3, 21, the surface levels of the molten silicon 2 in the crucibles 3, 21 are horizontally aligned with each other. The insulator 27 prevents the molten silicon 2 from being cooled when the molten silicon 2 flows through the joint pipe 26.

A material supply device 28 is mounted on the auxiliary chamber 20 for successively supplying a silicon material in the form of silicon pellets each having a diameter ranging from 0.1 to 1 mm through a material supply pipe 28a into the auxiliary crucible 21. A sensor 29 for detecting the surface level and temperature of the molten silicon 2 in the auxiliary crucible 21 and hence the surface level and temperature of the molten silicon 2 in the crucible 3, is mounted on the measurement window 20a.

Signals from the sensor 29 are supplied to a controller 30 which controls the heating means 24, the actuating mechanism 25, and the material supply device 28. The controller 30 processes the supplied signals from the sensor 29, and outputs signals to the heating means 24, the actuating mechanism 25, and the material supply device 28 to keep constant the surface level and temperature of the molten silicon 2 in the auxiliary crucible 21.

The material supply pipe 28a extends vertically through the upper end of the auxiliary chamber 20 and has a lower end opening slightly above the surface level of the molten silicon 2 in the auxiliary crucible 21. Based on a signal from the controller 30, the material supply device 28 intermittently supplies the pelletized silicon material through the material supply pipe 28a into the auxiliary crucible 21.

By supplying the pelletized silicon material into the auxiliary crucible 21 to keep the surface level of the molten silicon 2 constant therein, the surface level of the molten silicon 2 in the crucible 3 is also kept constant through the joint pipe 26. Therefore, the temperature of the molten silicon 2 in the crucible 3 is prevented from unduly varied as a result of the intermittent supply of the pelletized silicon material.

The molten silicon 2 in the crucible 3 is controlled in temperature by the heating means 8, and the molten silicon 2 in the auxiliary crucible 21 is controlled in temperature by the heating means 24 such that the temperatures of the molten silicon 2 in the crucibles 3, 24 are individually equalized to each other. Since the molten silicon 2 in the crucible 3 and the molten silicon 2 in the auxiliary crucible 21 communicate with each other through the joint pipe 26, the molten silicon 2 as a combined whole has a relatively large heat storage capacity and thermal inertia to stabilize its temperature highly accurately against disturbances.

The molten silicon 2 converted from the introduced pelletized silicon material is first stored in the auxiliary crucible 21 and then flows through the joint pipe 26 into the crucible 3. With the joint pipe 26 being positioned above the bottom of the crucible 21, harmful impurities containing in the molten silicon 2 and having relatively large specific gravities are settled down on the bottom of the auxiliary crucible 21 before the molten silicon 2 is transferred from the crucible 3 to the crucible 21. As a consequence, such harmful impurities are prevented from flowing into the crucible 3, or the influx into the crucible 3 is minimized.

The volume of the auxiliary crucible 21 is 1.5~100 times the volume of the crucible 3. Since the volumes of the crucibles 3, 21 are thus selected, the crucibles 3, 21 can jointly store an amount of molten silicon 2 which is large enough to retain a sufficient amount of thermal energy against undue temperature disturbances.

The apparatus according to the present invention operates as follows:

While the surface level of the molten silicon 2 in the crucible 3 is being kept constant, the molten silicon 2 in the crucible 3 is continuously pulled up at a predetermined speed through the opening 5a in the cover 5 and the openings 6a in the cooling plates 6 by the positioning and pulling-up mechanism 11. At this time, the molten silicon 2 as it is pulled up is cooled and solidified into a continuously elongate thin web 12 of single-crystal silicon having a width of 50 mm and a thickness of 0.14 mm, for example. The solidified web 12 of single-crystal silicon is pulled upwardly out of the chamber 1 at a constant speed by the positioning and pulling-up mechanism 11. As described above, the total molten silicon 2 has a relatively large heat storage capacity and is prevented from being unduly varied in temperature by the supply of the pelletized silicon material. Therefore, the temperature of the molten silicon 2 in the crucible 3 is stabilized highly accurately for the continuous production of the elongate thin web 12 of single-crystal silicon over a long period of time.

While the apparatus according to the illustrated embodiment is specifically designed for continuously producing an elongate thin web of single-crystal silicon, the principles of the present invention are applicable to the continuous manufacture of any of other elongate solid materials.

The solid material which can be manufactured by the apparatus of the present invention may be any of various semiconductor materials such as GaAs or the like, any of various jewels such as sapphire, or any of various ceramic materials. The solid material may be pulled up from the crucible in a rod shape, a filamentary shape, a tubular shape, or any of other elongate shape, other than the web shape. The solid material may also be pulled up as a polycrystalline material or a glass (amorphous) material, other than a singlecrystal material. The crucibles may be installed in any of various environments including air, an inert gas atmosphere, a vacuum atmosphere, or a high-pressure gas atmosphere. The crucibles may also be exposed to the ambient atmosphere, rather than being housed in the respective chambers.

Although a certain preferred embodiment of the present invention has been shown and described in detail, it should be understood that various changes and modifications may be made therein without departing from the scope of the appended claims.

What is claimed is:

1. An apparatus for continuously producing a solid material from a liquid material, comprising:

a first crucible for storing a liquid material therein;

a second crucible for storing a liquid material which is identical to and held in the same conditions as the liquid material in said first crucible wherein said second crucible has a volume which is 1.5 to 100 times the volume of said first crucible;

said first crucible and said second crucible being connected to each other by a substantially horizontal pipe at a position below surface levels of the respective liquid materials in said first and second crucibles;

a material supply device mounted on said second crucible for supplying a material to said second crucible; and a pulling-up mechanism mounted on said first crucible for continuously pulling the material upwardly from said first crucible at a predetermined speed while said material is being solidified into a solid material.

2. An apparatus according to claim 1, wherein said liquid material comprises molten silicon and said solid material comprises a thin web of single-crystal silicon.

3. An apparatus according to claim 1, further comprising a sensor for detecting a surface level and temperature of said liquid material in said second crucible; and control means for keeping constant said surface level and temperature of said liquid material in said second crucible.

4. An apparatus according to claim 1, wherein said horizontal pipe is positioned above a bottom of said second crucible.

5. An apparatus according to claim 1, wherein said horizontal pipe is covered with an insulator for keeping constant said temperature of said liquid material.

* * * * *